(12) United States Patent
Kim et al.

(10) Patent No.: US 11,356,106 B2
(45) Date of Patent: Jun. 7, 2022

(54) PHASE LOCKED LOOP AND ELECTRONIC DEVICE INCLUDING THE SAME

(71) Applicant: Samsung Electronics Co., Ltd., Suwon-si (KR)

(72) Inventors: Shinwoong Kim, Yongin-si (KR); Myounggyun Kim, Seoul (KR); Joonhee Lee, Goyang-si (KR); Sangwook Han, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/334,077

(22) Filed: May 28, 2021

(65) Prior Publication Data

US 2022/0077864 A1    Mar. 10, 2022

(30) Foreign Application Priority Data

Sep. 7, 2020  (KR) .................... 10-2020-0114044

(51) Int. Cl.
*H03L 7/099* (2006.01)
*H03L 7/093* (2006.01)
*H03D 3/24* (2006.01)

(52) U.S. Cl.
CPC ............ *H03L 7/099* (2013.01); *H03D 3/24* (2013.01); *H03L 7/093* (2013.01)

(58) Field of Classification Search
CPC ............ H03L 7/093; H03L 7/099; H03D 3/24
USPC ........ 331/16, 34, 1 A, 17; 327/156; 375/376
See application file for complete search history.

(56) References Cited

U.S. PATENT DOCUMENTS

| | | | |
|---|---|---|---|
| 7,466,207 B2 | 12/2008 | Staszewski et al. | |
| 7,868,672 B2 | 1/2011 | Geng et al. | |
| 8,076,960 B2 | 12/2011 | Geng et al. | |
| 8,433,026 B2 | 4/2013 | Ballantyne et al. | |
| 9,385,732 B2 | 7/2016 | Kim et al. | |
| 9,391,625 B1 | 7/2016 | Xu et al. | |
| 9,425,809 B2 | 8/2016 | Kobayashi | |
| 9,596,038 B2 | 3/2017 | Da Dalt et al. | |
| 9,628,308 B2 | 4/2017 | Muhammad et al. | |
| 9,985,638 B2 | 5/2018 | Xu et al. | |
| 10,419,009 B2 | 9/2019 | Shibata | |
| 2009/0102564 A1* | 4/2009 | Ballantyne ............... | H03C 3/08 331/10 |

OTHER PUBLICATIONS

Robert Bogdan Staszewski et al., "LMS-Based Calibration of an RF Digitally Controlled Oscillator for Mobile Phones" IEEE Transactions on Circcuite and Systems-ll: Express Briefs, vol. 53, No. 3, pp. 225-229, Mar. 2006.

(Continued)

*Primary Examiner* — Arnold M Kinkead
(74) *Attorney, Agent, or Firm* — Harness, Dickey & Pierce, P.L.C.

(57) ABSTRACT

An electronic device includes a phase locked loop configured to perform a two-point modulation operation on a data signal by using first and second modulation paths, and the phase locked loop is configured to generate, based on a differential value of a first phase error signal generated in the first modulation path, a gain for adjusting a frequency variation of the data signal through the second modulation path so as to match with the frequency variation of the data signal through the first modulation path.

20 Claims, 14 Drawing Sheets

(56) References Cited

OTHER PUBLICATIONS

Sungho Lee et al., "Self-Calibrated Two-Point Delta-Sigma Modulation Technique for RF Transmitters", IEEE Transactions on Microwave Theory and Techniques, vol. 58, No. 7, pp. 1748-1757, Jul. 2010.

* cited by examiner

PHASE LOCKED LOOP AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2020-0114044, filed on Sep. 7, 2020, in the Korean Intellectual Property Office, the disclosure of which is incorporated by reference herein in its entirety.

BACKGROUND

Example embodiments of the inventive concepts relate to an electronic device. For example, at least some example embodiments relate to a phase locked loop configured to perform a two-point modulation operation and/or an electronic device including the phase locked loop.

A phase locked loop is a circuit that is generally used to adjust a frequency and/or a phase of an oscillator and may be used to lock a frequency and/or a phase of an oscillator to a reference frequency signal having an accurate frequency.

In some applications, the frequency and/or the phase of the oscillator may be modulated using the phase locked loop in response to a data signal. With the development of technology, a phase locked loop may support a two-point modulation technique to modulate a data signal having a wide bandwidth. The two-point modulation technique is for performing modulation of a data signal by using two modulation paths included in the phase locked loop. In the two modulation paths, frequency variations of data signals may have a mismatch that negatively affects the performance of the phase locked loop.

SUMMARY

Thus, to solve this problem, example embodiments are directed to a configuration and/or a method for searching for effective gains applied to a certain modulation path.

Example embodiments of the inventive concepts provide a phase locked loop configured to quickly generate, based on a differential value of a phase error signal, a gain for solving a mismatch between frequency variations of data signals in modulation paths through which the data signals are applied, and/or an electronic device including the phase locked loop.

According to an example embodiment of the inventive concepts, there is provided an electronic device including a phase locked loop configured to perform a two-point modulation operation on a data signal using first and second modulation paths by, generating a gain based on a differential value of a first phase error signal generated in the first modulation path, and adjusting a frequency variation of the data signal through the second modulation path to match the frequency variation of the data signal through the first modulation path.

According to another example embodiment of the inventive concepts, there is provided an electronic device a processor configured to, perform a two-point modulation operation on a data signal through first and second modulation paths of a digital phase locked loop by, generating a gain based on a differential value of a phase error signal generated in the first modulation path, and adjusting a frequency variation of the data signal through the second modulation path to match the frequency variation of the data signal through the first modulation path.

According to another example embodiment of the inventive concepts, there is provided an operation method including applying a data signal to a lowpass modulation path and a highpass modulation path of a phase locked loop; generating a differential value from a phase error signal generated in the lowpass modulation path; generating a gain for adjusting a frequency variation of the data signal through the highpass modulation path, based on the differential value; and performing a two-point modulation operation on the data signal through the lowpass modulation path and the highpass modulation path, based on the gain.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Hereinafter, one or more example embodiments of the inventive concepts will be described in detail with reference to the attached drawings.

Figure 1:
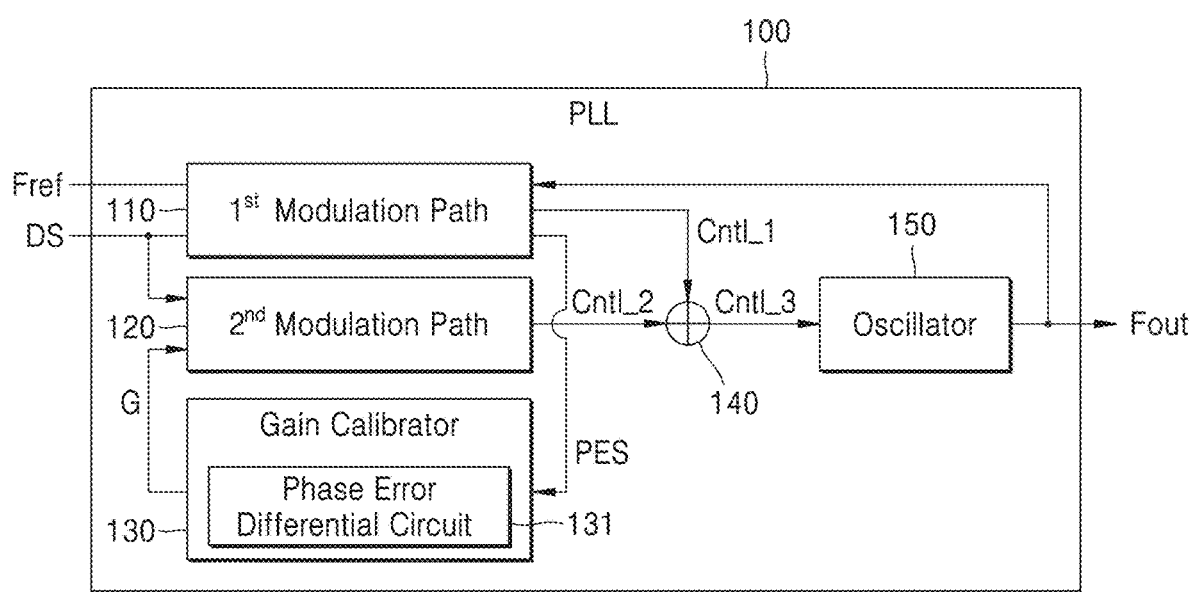
FIG. 1 is a block diagram of a phase locked loop according to an example embodiment.

FIG. 1 is a block diagram of a phase locked loop 100 according to an example embodiment.

Referring to FIG. 1, the phase locked loop 100 may include first and second modulation paths 110 and 120, a gain calibrator 130, a summer 140, and an oscillator 150. The phase locked loop 100 according to an example embodiment may perform two-point modulation on data signals DS by using the first and second modulation paths 110 and 120 and may adaptively perform matching of frequency variations in the first and second modulation paths 110 and 120. The two-point modulation may be referred to as dual port modulation. In some example embodiments, the first modulation path 110 may be a lowpass modulation path, and the second modulation path 120 may be a highpass modulation path. However, this is merely an example, and one or more example embodiments are not limited thereto.

In an example embodiment, the first modulation path 110 may receive an output signal (or an output frequency signal) Fout output from the oscillator 150, a reference frequency signal Fref, and the data signal DS. The first modulation path 110 may generate a first control signal Cntl_1 based on the output signal Fout, the reference frequency signal Fref, and the data signal DS. For example, the first modulation path 110 may divide the output signal Fout at a division ratio matching with a center frequency of a selected channel and the data signal DS and may compare the divided signal with the reference frequency signal Fref, thereby generating a phase error signal PES. The first modulation path 110 may generate the first control signal Cntl_1 in response to the phase error signal PES. A detailed configuration example of the first modulation path 110 will be described with reference to FIG. 2.

The second modulation path 120 may receive the data signal DS and may perform a modulation operation on the data signal DS. For better understanding, FIG. 1 illustrates that the oscillator 150 is not included in the second modulation path 120, but the second modulation path 120 may include the oscillator 150. In this case, a first frequency variation of the data signal DS in the first modulation path 110 may be different from a second frequency variation of the data signal DS in the second modulation path 120. For example, the first frequency variation may be greater than the second frequency variation. Accordingly, the second modulation path 120 may adjust the second frequency variation by using a gain G received from the gain calibrator 130 and may identically or similarly match the adjusted second frequency variation with the first frequency variation. The second modulation path 120 may generate a second control signal Cntl_2 based on the data signal DS and the gain G. A detailed configuration example of the second modulation path 120 will be described with reference to FIG. 2.

The gain calibrator 130 according to an example embodiment may include a phase error differential circuit 131. The gain calibrator 130 may generate a differential value by differentiating the phase error signal PES, which is received from the first modulation path 110, by using the phase error differential circuit 131 in every certain timing and may generate the gain G based on the differential value. The differential value of the phase error signal PES may indicate a scale of how much a current gain G has to be calibrated, and a calibration degree of the current gain G may be determined in linear or non-linear proportion to the differential value. The gain calibrator 130 may generate the gain G by using the differential value of the phase error signal PES and thus may quickly and effectively calibrate the gain G to have a value that allows a decrease in a difference between the first and second frequency variations. Detailed descriptions regarding the first and second frequency variations will be described with reference to FIG. 2.

In an example embodiment, the summer 140 may receive and aggregate the first and second control signals Cntl_1 and Cntl_2 and generate a third control signal Cntl_3. The oscillator 150 may receive the third control signal Cntl_3 and generate the output signal Fout in response to the third control signal Cntl_3.

The phase locked loop 100 may lock a center frequency of a selected channel by repeating a modulation loop using the gain calibrator 130 and the first and second modulation paths 110 and 120 and may output the output signal Fout having a pattern corresponding to the data signal DS.

In some example embodiments, the phase locked loop 100 may calibrate the gain G as part of a background operation of an electronic device including the phase locked loop 100, and the data signal DS used during the calibration of the gain G may include a certain pattern (e.g., a training pattern). When the gain G has an appropriate value, the phase locked loop 100 may receive the data signal DS including data required for actual communications, and may output the output signal Fout having the pattern corresponding to the data signal DS.

In an example embodiment, the phase locked loop 100 may be a digital phase locked loop realized by processing circuitry executing software which transforms the processing circuitry into a special purpose processor. Operations performed by the phase locked loop 100 are a series of command codes and are stored in a certain memory, and the command codes may be executed by the processing circuitry. The processing circuitry may be hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a programmable logic unit, a microprocessor, application-specific integrated circuit (ASIC), etc.

Also, in some other example embodiments, the phase locked loop 100 may be realized as a combination of hardware and software, and in this case, the phase locked loop 100 may further include an Analog to Digital Converter (ADC) or a Digital to Analog Converter (DAC) for interfacing between a hardware component and a software component. Furthermore, in still other example embodiments, the phase locked loop 100 may be an analog phase locked loop realized as hardware.

The processing circuitry may be special purpose processing circuitry that operates as a phase locked loop and the various sub-components thereof discussed in detail herein such that the phase locked loop is configured to quickly generate, based on a differential value of a phase error signal, a gain for resolving a mismatch between frequency variations of data signals in modulation paths through which the data signals are applied.

Hereinafter, an example in which the phase locked loop 100 is a digital phase locked loop is mainly described. However, this is merely an example, and one or more example embodiments of the inventive concepts. The phase locked loop 100 may be realized in various manners.

Figure 2:
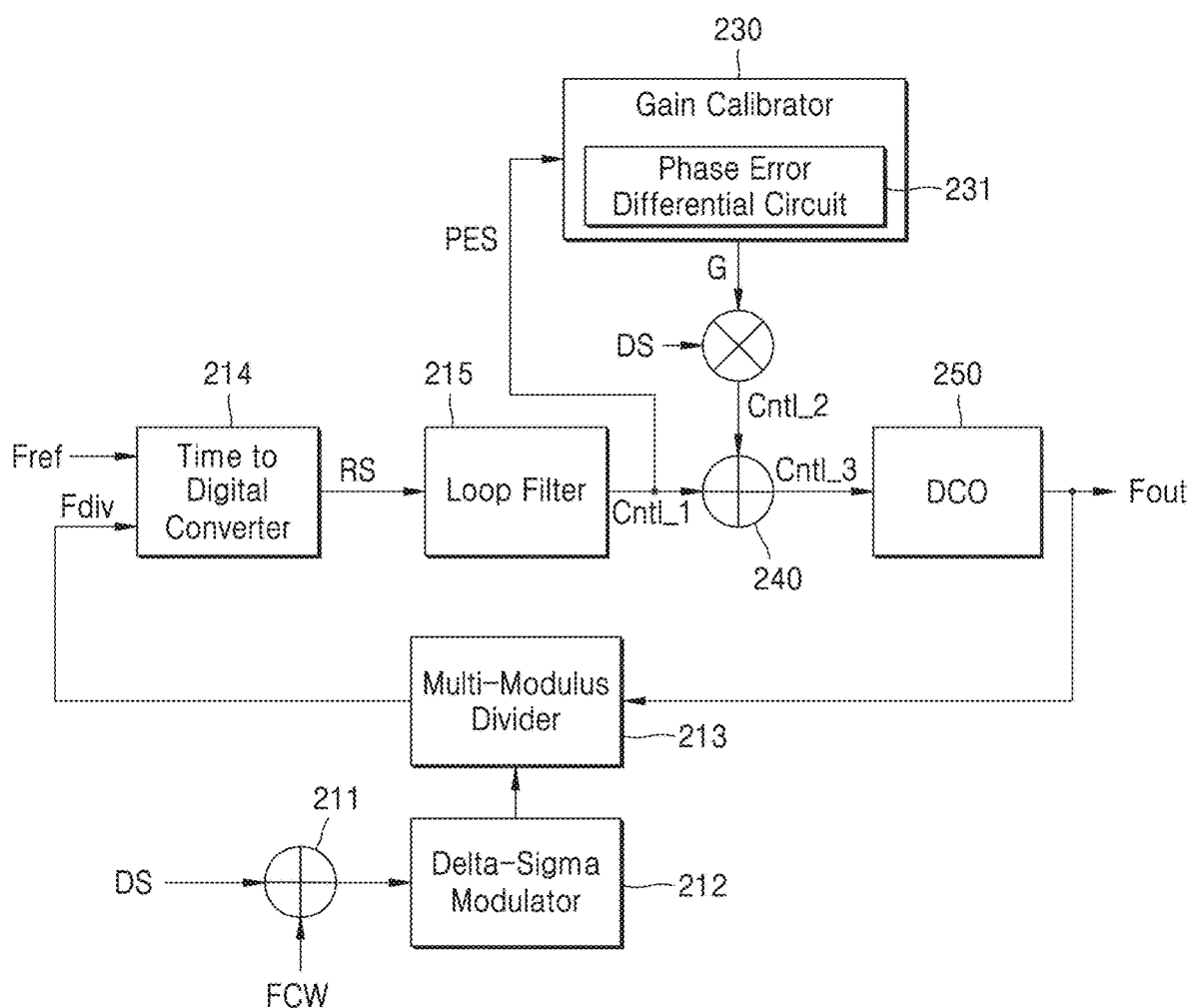
FIG. 2 is a block diagram illustrating in detail a phase locked loop according to an example embodiment.

FIG. 2 is a block diagram illustrating in detail a phase locked loop 200 according to an example embodiment.

Referring to FIG. 2, the phase locked loop 200 may include a delta-sigma modulator 212, a multi-modulus divider 213, a time to digital converter 214, a loop filter 215, first and second summers 211 and 240, a multiplier 221, and a digital control oscillator 250.

For example, as discussed above, the processing circuitry included in the phase locked loop 200 may be a hardware block including an analog circuit and/or a digital circuit, and may be implemented by the processing circuitry executing software including a plurality of instructions that transform the processing circuitry into special purpose processing circuitry to perform the functions of the components of the phase locked loop, such as, the delta-sigma modulator 212, the multi-modulus divider 213, the time to digital converter 214, the loop filter 215, the first and second summers 211 and 240, a multiplier 221, and the digital control oscillator 250.

The first summer 211 may synthesize the data signal DS and a frequency command word FCW with each other and may provide a synthesized signal to the delta-sigma modulator 212. The frequency command word FCW may determine a division ratio of the multi-modulus divider 213, may be time-variant, and may change in a certain cycle. The delta-sigma modulator 212 may provide the multi-modulus divider 213 with a pulse signal having a duty ratio and an amplitude corresponding to a signal that is synthesized for a certain period of time. The multi-modulus divider 213 may divide the output signal Fout that is received from the digital control oscillator 250 as feedback, based on the division ratio determined in response to the pulse signal. The time to digital converter 214 may receive a divided signal Fdiv that is divided from the multi-modulus divider 213 and may receive the reference frequency signal Fref from the outside. The time to digital converter 214 may compare a phase of the divided signal Fdiv with that of the reference frequency signal Fref and may generate a comparison signal RS indicating a comparison result. The comparison signal RS may include at least one bit and indicate a difference between the phases of the divided signal Fdiv and the reference frequency signal Fref. The loop filter 215 may generate the first control signal Cntl_1 including the phase error signal PES between the divided signal Fdiv and the reference frequency signal Fref, based on the comparison signal RS. In some example embodiments, the phase error signal PES may be a signal identical to the first control signal Cntl_1, a signal changed from the first control signal Cntl_1, or part of the first control signal Cntl_1. The time to digital converter 214 may be referred to as a phase-digital converter. The first control signal Cntl_1 may be defined as a signal for decreasing the difference between the phases of the divided signal Fdiv and the reference frequency signal Fref.

In an example embodiment, the gain calibrator 230 may include a phase error differential circuit 231. The gain calibrator 230 may generate a differential value of the phase error signal PES, which is received from the loop filter 215, by using the phase error differential circuit 231 and may generate the gain G based on the generated differential value. The multiplier 221 may generate the second control signal Cntl_2 by multiplying the data signal DS and the gain G received from the gain calibrator 230.

Hereinafter, the first modulation path (or the lowpass modulation path) may include the first summer 211, the delta-sigma modulator 212, the multi-modulus divider 213, the time to digital converter 214, and the loop filter 215, and the second modulation path (or the highpass modulation path) may include the second summer 240 and the digital control oscillator 250.

$$\Delta F1 = \text{ref\_}F \cdot F_{DS}$$

$$\Delta F2 = K_{DCO} \cdot F_{DS} \cdot G \qquad \text{[Equation 1]}$$

Referring to [Equation 1], $\Delta F1$ indicates the first frequency variation of the first modulation path, ref_F indicates a reference frequency of the reference frequency signal Fref, and $F_{DS}$ indicates a frequency of the data signal DS. The first frequency variation $\Delta F1$ may be a value obtained by multiplying the reference frequency ref and the frequency $F_{DS}$ of the data signal DS.

$\Delta F2$ indicates the second frequency variation of the second modulation path, $K_{DCO}$ indicates an oscillation gain of the digital control oscillator 250, and G indicates a gain generated by the gain calibrator 230. The first frequency variation $\Delta F1$ may be a value obtained by multiplying the reference frequency ref_F and the frequency $F_{DS}$ of the data signal DS.

$$G = \text{ref\_}F / K_{DCO} \qquad \text{[Equation 2]}$$

Referring to [Equation 2], the gain G for solving the mismatch between the first frequency variation $\Delta F1$ and the second frequency variation $\Delta F2$ may be determined as a ratio of the reference frequency ref_F and the oscillation gain $K_{DCO}$. However, the oscillation gain $K_{DCO}$ does not have a uniform value in all frequency control section and have nonlinear characteristics that change according to Process/Voltage/Temperature (PVT), and thus, a desired (or, alternatively, an optimum) value of the gain G may differ.

Referring back to FIG. 2, the gain calibrator 230 according to an example embodiment may quickly and effectively calibrate the gain G to have a desired (or, alternatively, an optimum) value for reducing a mismatch between the frequency variations in the first and second modulation paths, based on the differential value of the phase error signal PES.

The second summer 240 may generate the third control signal Cntl_3 by aggregating the first control signal Cntl_1 received from the loop filter 215 and the second control signal Cntl_2 received from the multiplier 221. The digital control oscillator 250 may generate the output signal Fout in response to the third control signal Cntl_3. In some example embodiments, the output signal Fout may be referred to as a modulated signal, may include a pattern matching with the data signal DS, and may be transmitted to a certain receiver through a selected channel.

Figure 3:
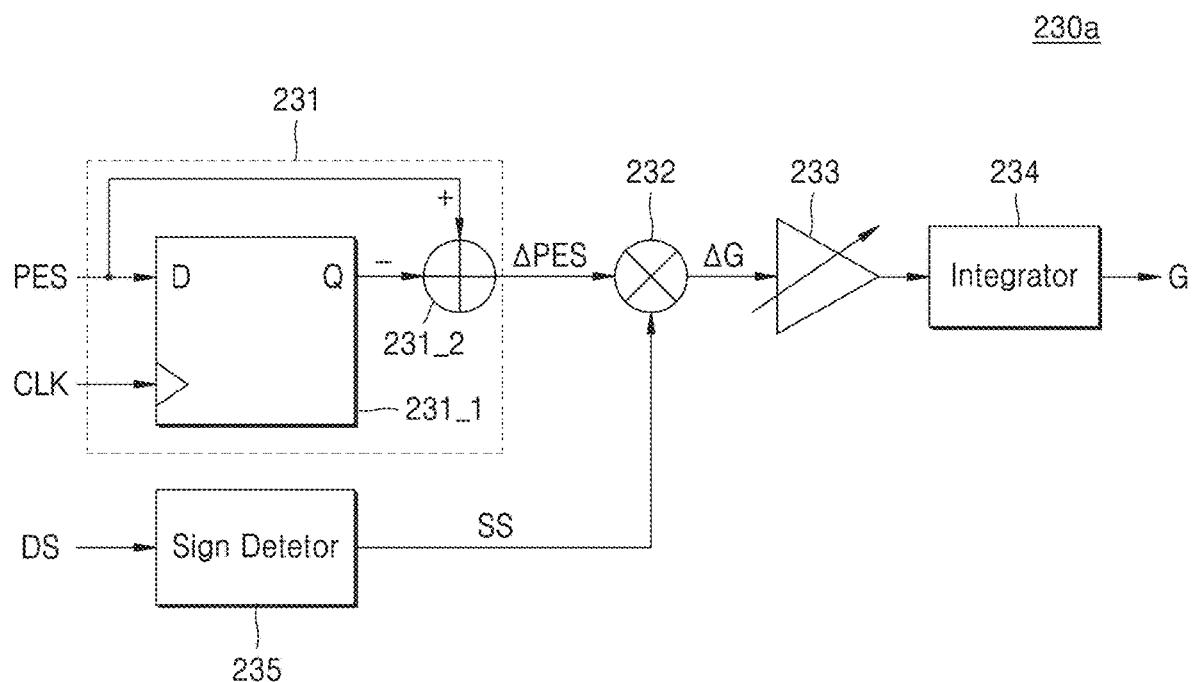
FIG. 3 is a block diagram of a gain calibrator according to an example embodiment.
Figure 4:
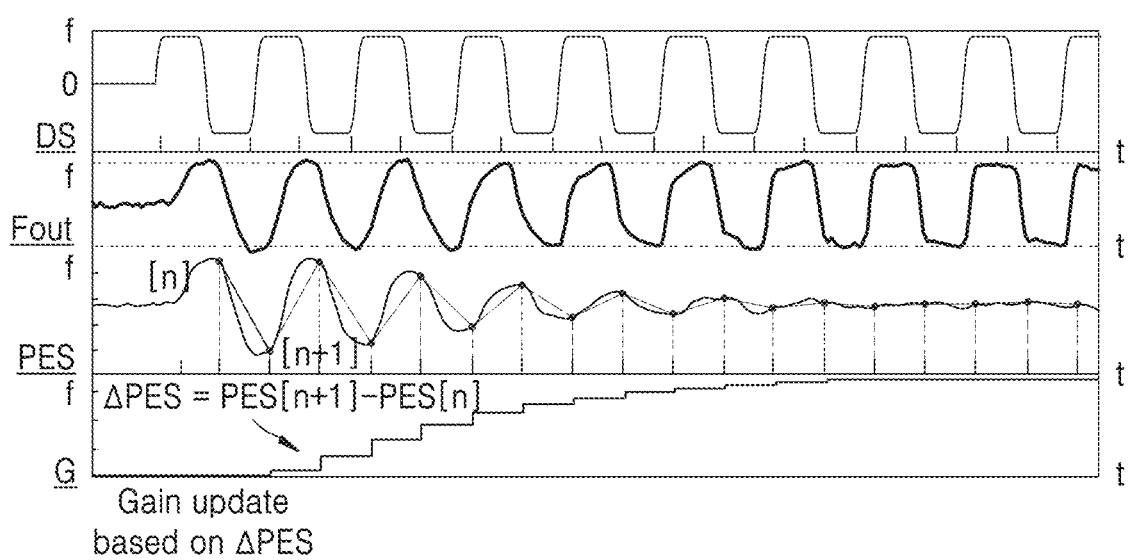
FIGS. 4 and 5 are diagrams for explaining operations of the gain calibrator of FIG. 3.
Figure 5:
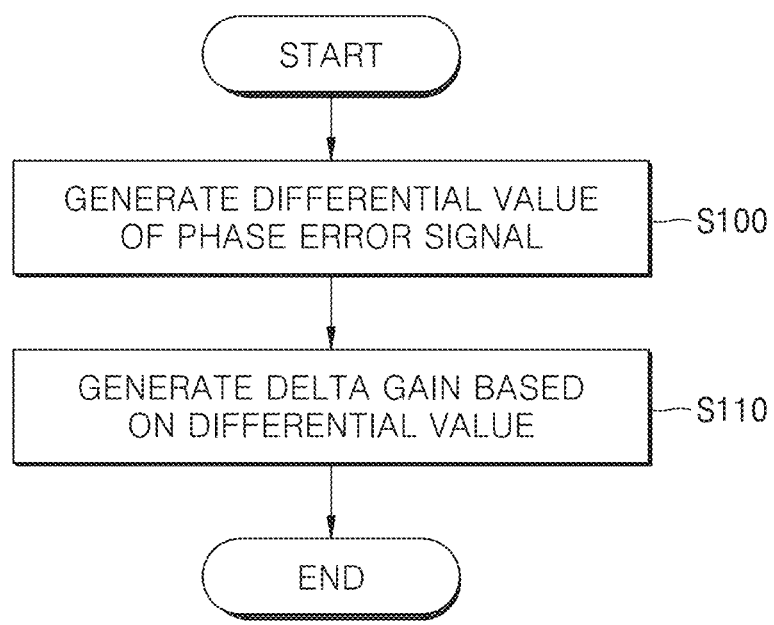

FIG. 3 is a block diagram illustrating a gain calibrator 230a according to an example embodiment, and FIGS. 4 and 5 are diagrams for explaining an operation of the gain calibrator 230a of FIG. 3. Hereinafter, a configuration of the gain calibrator 230a described below is merely an example embodiment, and the example embodiments are not limited thereto. It is obvious that various changes may be made to the gain calibrator 230a.

Referring to FIG. 3, the gain calibrator 230a may include the phase error differential circuit 231, a correlator 232, a variable gain amplifier 233, an integrator 234, and a sign detector 235. The phase error differential circuit 231 may include a flip flop 231_1 and a subtractor 231_2.

In an example embodiment, the flip flop 231_1 may output the phase error signal PES to the subtractor 231_2 in every certain timing in response to a clock signal CLK. For example, the clock signal CLK may have a frequency synchronized with a phase locked loop. The subtractor 231_2 may generate a differential value $\Delta$PES by subtracting the phase error signal PES in an $n^{th}$ point of time from the phase error signal PES in an $(n+1)^{th}$ point in time (where, n is an integer equal to or greater than 1).

The sign detector 235 may receive the data signal DS and detect a sign of the data signal DS, thereby generating a sign signal SS. The correlator 232 may receive the differential value $\Delta$PES and the sign signal SS, determine a sign of a delta gain $\Delta$G based on a sign of the differential value $\Delta$PES and the sign signal SS, and determine a magnitude of the delta gain $\Delta$G based on the differential value $\Delta$PES. The correlator 232 may generate the delta gain $\Delta$G and provide the generated delta gain $\Delta$G to the variable gain amplifier 233.

The variable gain amplifier 233 may amplify the delta gain $\Delta$G with a certain gain and provide the scaled delta gain $\Delta$G to the integrator 234. In some example embodiments, the variable gain amplifier 233 may scale the delta gain $\Delta$G by amplifying the delta gain $\Delta$G based on a variable gain, and a detailed example thereof will be described below. The integrator 234 may accumulate a newly generated delta gain $\Delta$G based on a previously generated delta gain $\Delta$G and generate the gain G.

Referring further to FIG. 4, the data signal DS may have a certain frequency and duty ratio, and the output signal Fout may be controlled by the phase locked loop (200 of FIG. 2)

to include a pattern corresponding to the data signal DS. For example, the phase error differential circuit 231 may generate an $n^{th}$ differential value ΔPES [n] by subtracting a phase error signal PES in an $n^{th}$ point in time [n] from a phase error signal PES in an $(n+1)^{th}$ point in time [n+1]. The gain calibrator 230a may generate an $n^{th}$ delta gain ΔG[n] based on the $n^{th}$ differential value ΔPES [n]. The gain G may be converged to a desired (or, alternatively, an optimum) value as multiple delta gains are accumulated by the gain calibrator 230a. As shown in FIG. 4, a magnitude of the delta gain may be in linear or nonlinear proportion to a magnitude of the differential value of the phase error signal PES.

Because an initial value of the gain G is greatly different from a desired (or, alternatively, an optimum) value thereof, the gain calibrator 230a according to an example embodiment may significantly reduce a time taken to converge the gain G to the desired (or, alternatively, the optimum) value by roughly calibrating the gain G at an initial stage by using the differential value of the phase error signal PES.

Referring further to FIG. 5, in operation S100, the gain calibrator 230a may receive the phase error signal PES and generate the differential value ΔPES of the phase error signal PES by using the phase error differential circuit 231. In operation S110, the gain calibrator 230a may generate the delta gain ΔG based on the differential value ΔPES. The gain calibrator 230a may generate delta gains ΔG by repeatedly performing operations S110 and S120 for a certain period of time and may generate the gain G by accumulating the delta gains ΔG.

Figure 6:
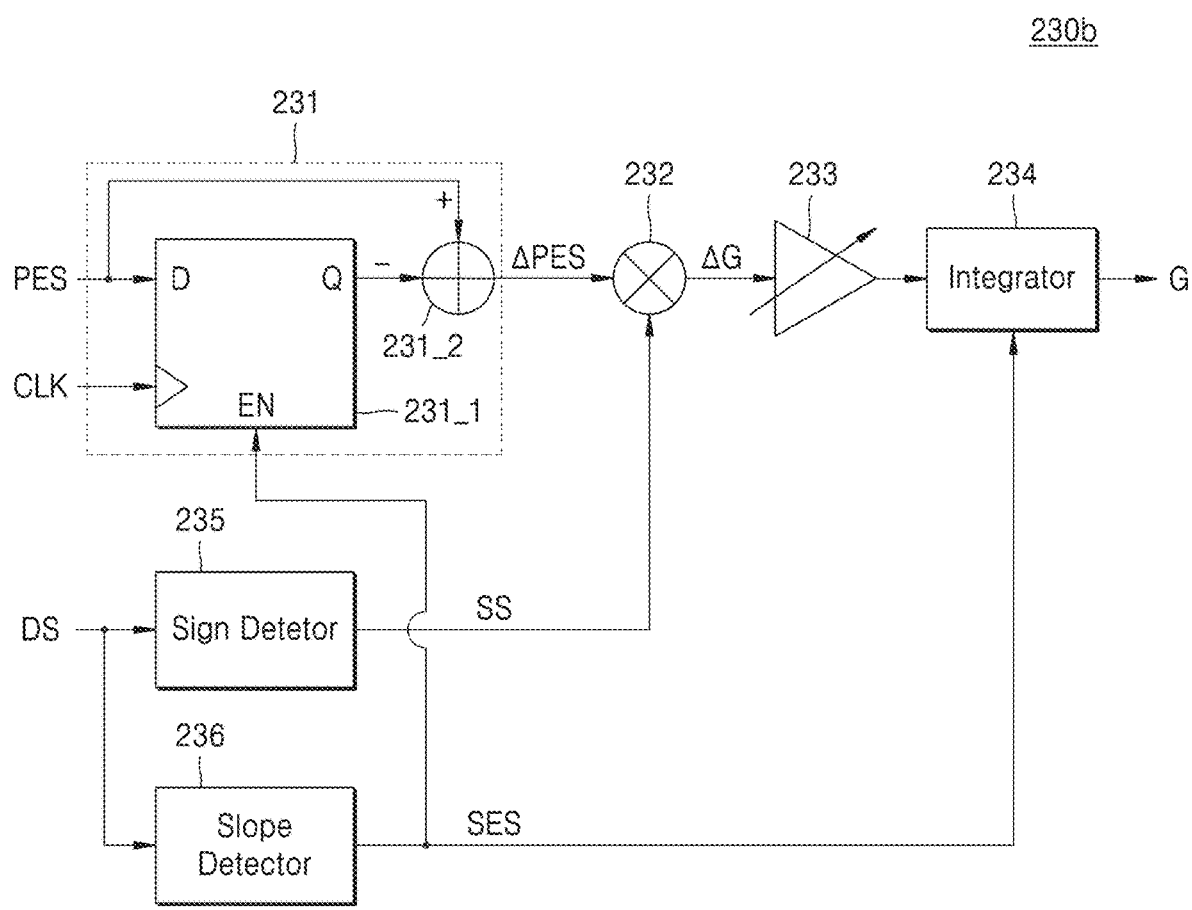
FIG. 6 is a block diagram of a gain calibrator according to an example embodiment.

FIG. 6 is a block diagram of a gain calibrator 230b according to an example embodiment. Descriptions overlapping with those regarding the gain calibrator 230a of FIG. 3 will be omitted in FIG. 6.

Referring to FIG. 6, the gain calibrator 230b may include the phase error differential circuit 231, the correlator 232, the variable gain amplifier 233, the integrator 234, the sign detector 235, and a slope detector 236.

In an example embodiment, the slope detector 236 may receive the data signal DS, detect a slope of the data signal DS, and generate a slope edge signal SES indicating a level transition timing of the data signal DS according to a detection result. The flip flop 231_1 may be enabled to output the phase error signal PES to the subtractor 231_2 in response to the slope edge signal SES. Also, the integrator 234 may accumulate the delta gain ΔG in response to the slope edge signal SES. That is, the slope detector 236 according to an example embodiment may control the phase error differential circuit 231 and the integrator 234 to make the differential value ΔPES of the phase error signal PES and the delta gain ΔG be generated only at the level transition timing of the data signal DS causing a level transition of the phase error signal PES and make the delta gain ΔG be accumulated at the level transition timing of the data signal DS.

The unnecessary generation of the differential value ΔPES and the accumulation of the delta gains ΔG are prevented because of the configuration of the slope detector 236 according to an example embodiment, and thus, the effective power consumption of the phase locked loop and the generation of the gain G having a desired (or, alternatively, an optimum) value may be achieved.

Figure 7A:
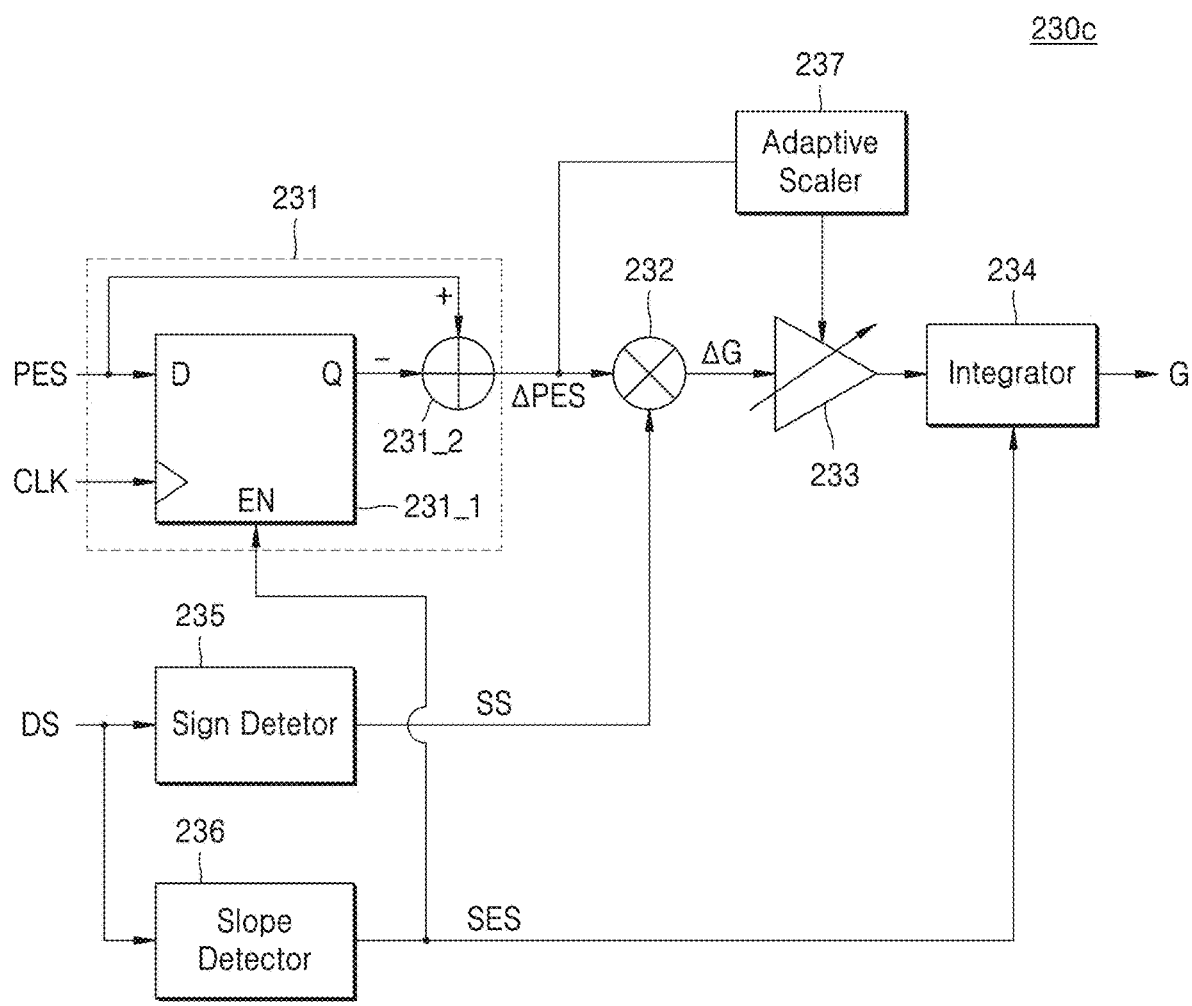
FIGS. 7A and 7B are block diagrams of a gain calibrator according to an example embodiment.
Figure 7B:
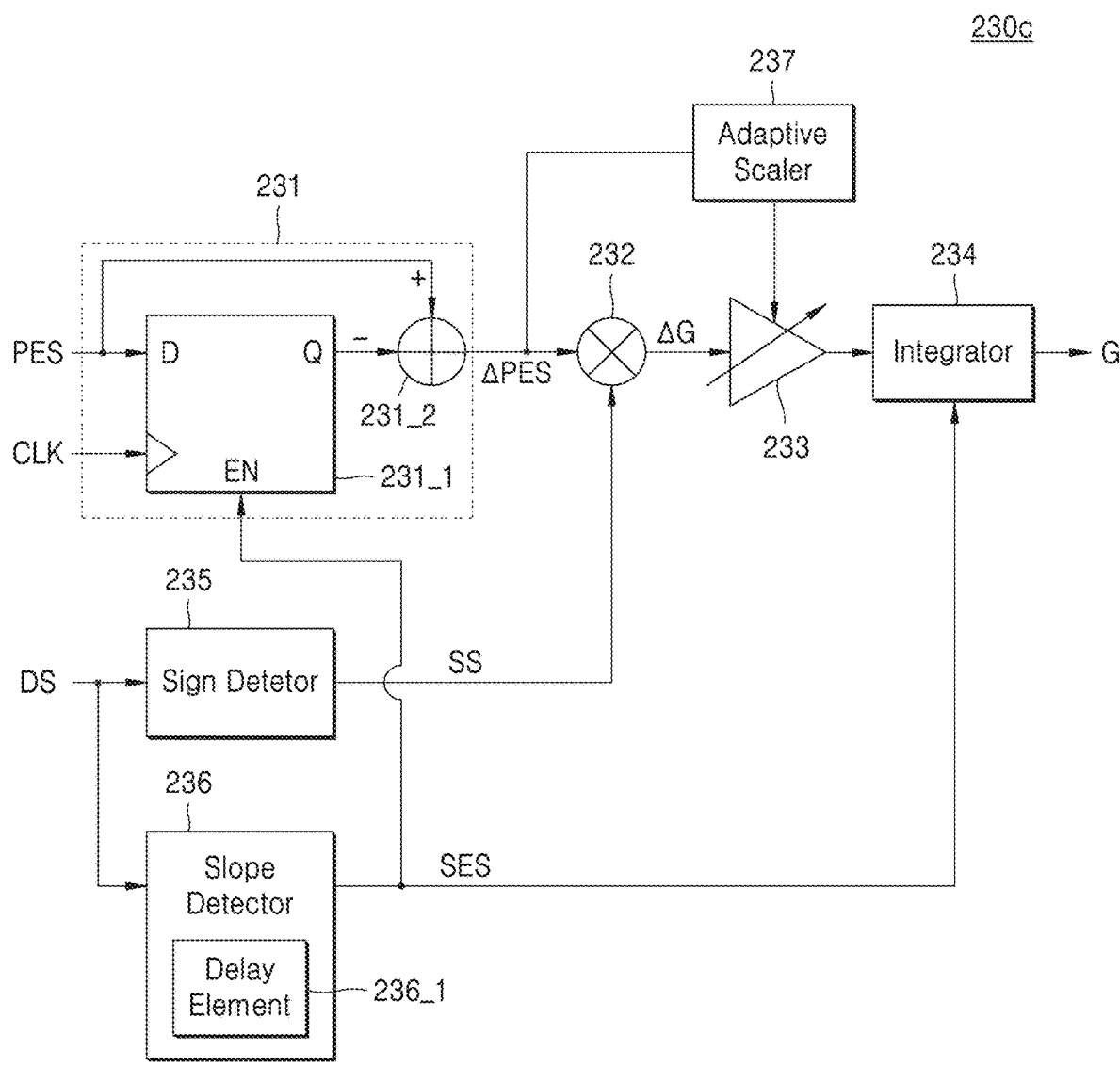

FIGS. 7A and 7B are block diagrams of a gain calibrator 230c according to an example embodiment. Hereinafter, descriptions overlapping with the descriptions regarding the gain calibrators 230a and 230b of FIGS. 3 and 6 will be omitted.

Referring to FIG. 7A, the gain calibrator 230c may include the phase error differential circuit 231, the correlator 232, the variable gain amplifier 233, the integrator 234, the sign detector 235, the slope detector 236, and an adaptive scaler 237.

In an example embodiment, the adaptive scaler 237 may receive the differential value ΔPES of the phase error signal PES, identify whether the differential value ΔPES is included in a reference range, and scale the delta gain ΔG based on an identification result. In detail, when the differential value ΔPES is not included in the reference range, the adaptive scaler 237 may not perform a scaling operation on the delta gain ΔG and when the differential value ΔPES is included in the reference range, the adaptive scaler 237 may perform the scaling operation on the delta gain ΔG. That is, when the differential value ΔPES is included in the reference range, it may be considered that a current value of the gain G is close to a desired (or, alternatively, an optimum) value to some extent, and the adaptive scaler 237 may scale the delta gain ΔG small and support the fine calibration of the gain G. A scale ratio may be set in advance in the adaptive scaler 237. In some example embodiments, the reference range may be subdivided into ranges, and a scale ratio may be set in advance for each range.

However, one or more embodiments are not limited thereto. When the differential value ΔPES is not included in the reference range, the adaptive scaler 237 may perform the scaling operation on the delta gain ΔG, and when the differential value ΔPES is included in the reference range, the adaptive scaler 237 may not perform the scaling operation on the delta gain ΔG. That is, when the differential value ΔPES is not included in the reference range, it may be considered that the current value of the delta gain ΔG is vastly different from the desired (or, alternatively, optimum) value thereof, and the adaptive scaler 237 may greatly scale the delta gain ΔG and support the rapid calibration of the gain G.

In an example embodiment, the adaptive scaler 237 may provide the variable gain amplifier 233 with a signal for adjusting a gain of the variable gain amplifier 233 to scale the delta gain ΔG.

In an example embodiment, the adaptive scaler 237 may set the reference range based on a maximum value and a minimum value of the phase error signal generated from a test data signal for a certain period of time. The test data signal may include a pattern that is determined in advance to set the reference range. In detail, the adaptive scaler 237 may adaptively set a wide reference range as a difference between the minimum value and the maximum value increases, and the adaptive scaler 237 may adaptively set a narrow reference range as the difference between the minimum value and the maximum value decreases. The adaptive scaler 237 may also set the reference range by multiplying the minimum value and the maximum by certain ratios, respectively.

Referring further to FIG. 7B, the slope detector 236 may further include a delay element 236_1, compared to the illustration of FIG. 7A. The delay element 236_1 may provide the flip flop 231_1 and the integrator 234 with the slope edge signal SES that is delayed by delaying the slope edge signal SES. That is, the delay element 236_1 may delay the slope edge signal SES by a certain clock cycle to perform a gain calibration operation according to a response speed of the phase locked loop including the gain calibrator 230c. Thus, the gain calibrator 230c may generate a gain G having an optimum value by performing a calibration operation on the gain G that is synchronized with a timing of a modulation operation of the phase locked loop.

Figure 8A:
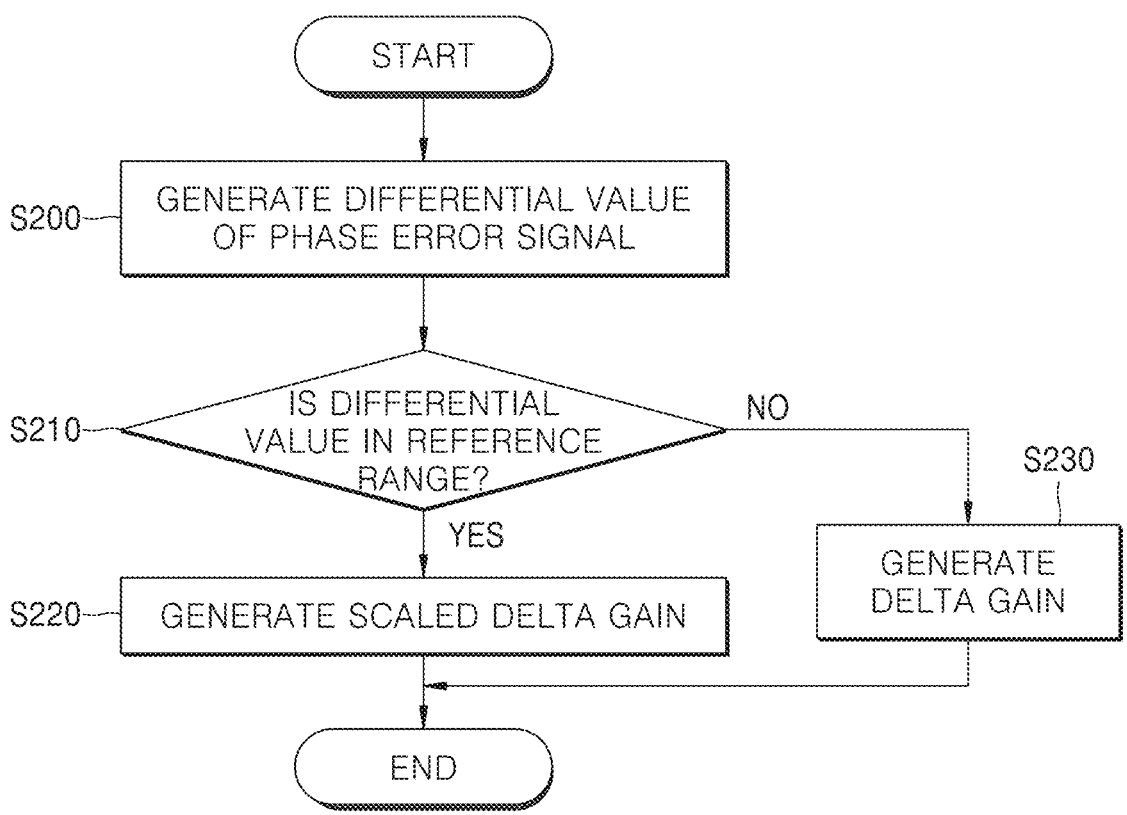
FIGS. 8A and 8B are diagrams for explaining an operation method of the gain calibrator of FIG. 7A.
Figure 8B:
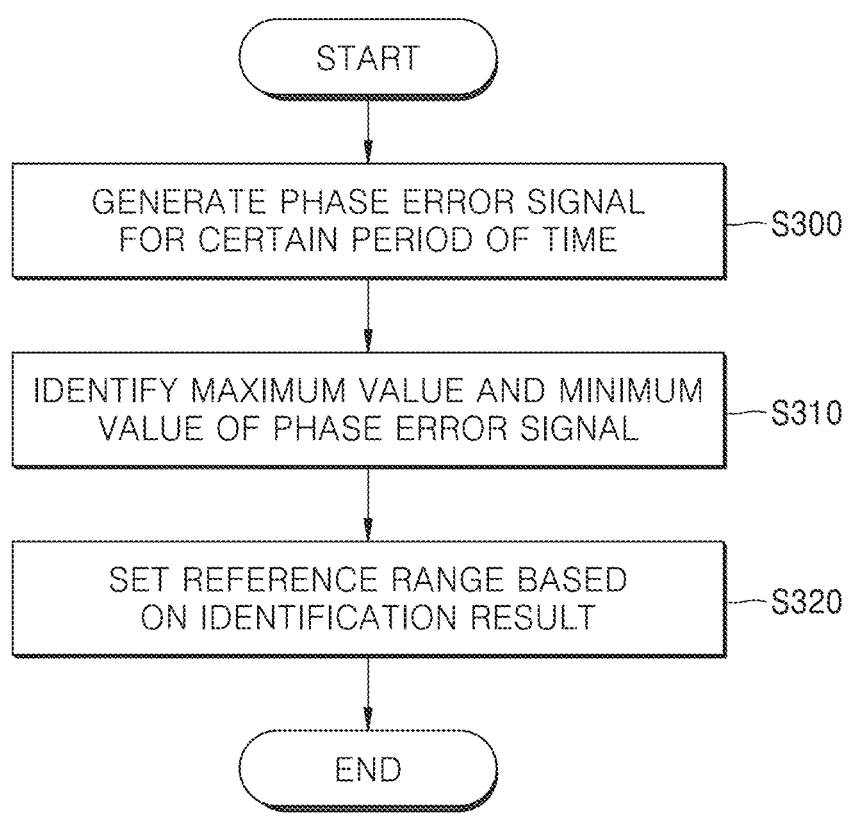

FIGS. 8A and 8B are diagrams for explaining an operation method of the gain calibrator 230c of FIG. 7A.

Referring to FIGS. 7A and 8A, in operation S200, the phase error differential circuit 231 may generate the differential value ΔPES from the phase error signal PES. In operation S210, the adaptive scaler 237 may receive the differential value ΔPES and determine whether the differential value ΔPES is in the reference range. When the differential value ΔPES is in the reference range ('YES') in operation S210, the correlator 232 may generate the delta gain ΔG based on the differential value ΔPES and the sign signal SS in operation S220, and the adaptive scaler 237 may scale the delta gain ΔG at a certain ratio and may generate a scaled delta gain. For example, the adaptive scaler 237 may scale the magnitude of the delta gain ΔG to be small. When the differential value ΔPES is not in the reference range ('NO') in operation S210, the correlator 232 may generate the delta gain ΔG based on the differential value ΔPES and the sign signal SS in operation S230, and the adaptive scaler 237 may not separately perform the scaling operation on the delta gain ΔG.

Referring further to FIG. 8B, in operation S300, the gain calibrator 230c may generate the phase error signal PES by receiving a training data signal for a certain period of time. For example, the training data signal may include a desired (or, alternatively, a predefined) pattern to set the reference range. In operation S310, the gain calibrator 230c may identify a maximum value and a minimum value of the phase error signal PES. In operation S320, the gain calibrator 230c may set the reference range based on an identification result. In an example embodiment, the gain calibrator 230c may set the reference range by considering at least one of the maximum value and the minimum value of the phase error signal PES.

Figure 9:
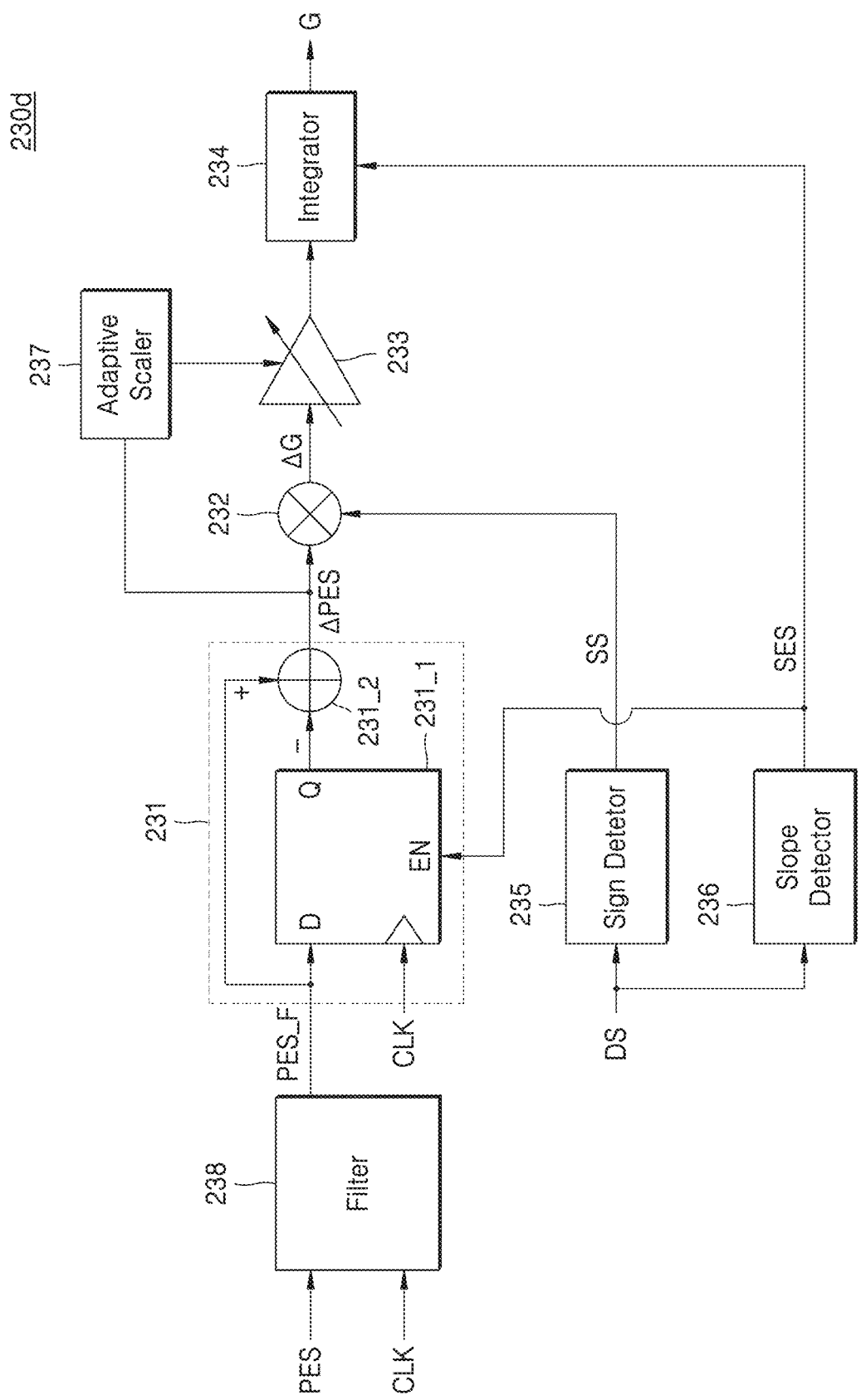
FIG. 9 is a block diagram of a gain calibrator according to an example embodiment.

FIG. 9 is a block diagram of a gain calibrator 230d according to an example embodiment. Descriptions overlapping with the description regarding the gain calibrator 230c of FIG. 7A will be omitted in FIG. 9.

Referring to FIG. 9, the gain calibrator 230d may include the phase error differential circuit 231, the correlator 232, the variable gain amplifier 233, the integrator 234, the sign detector 235, the slope detector 236, and a filter 238.

In an example embodiment, the filter 238 may filter high-frequency components of the phase error signal PES. The filter 238 may provide a filtered phase error signal PES_F to the phase error differential circuit 231. The phase error differential circuit 231 may accurately generate the differential value ΔPES by using the filtered phase error signal PES_F from which the high-frequency components are removed.

In an example embodiment, the filter 238 may be embodied in various forms such as a moving average filter, a Finite Impulse Response (FIR) filter, etc. for filtering high-frequency components.

Figure 10:
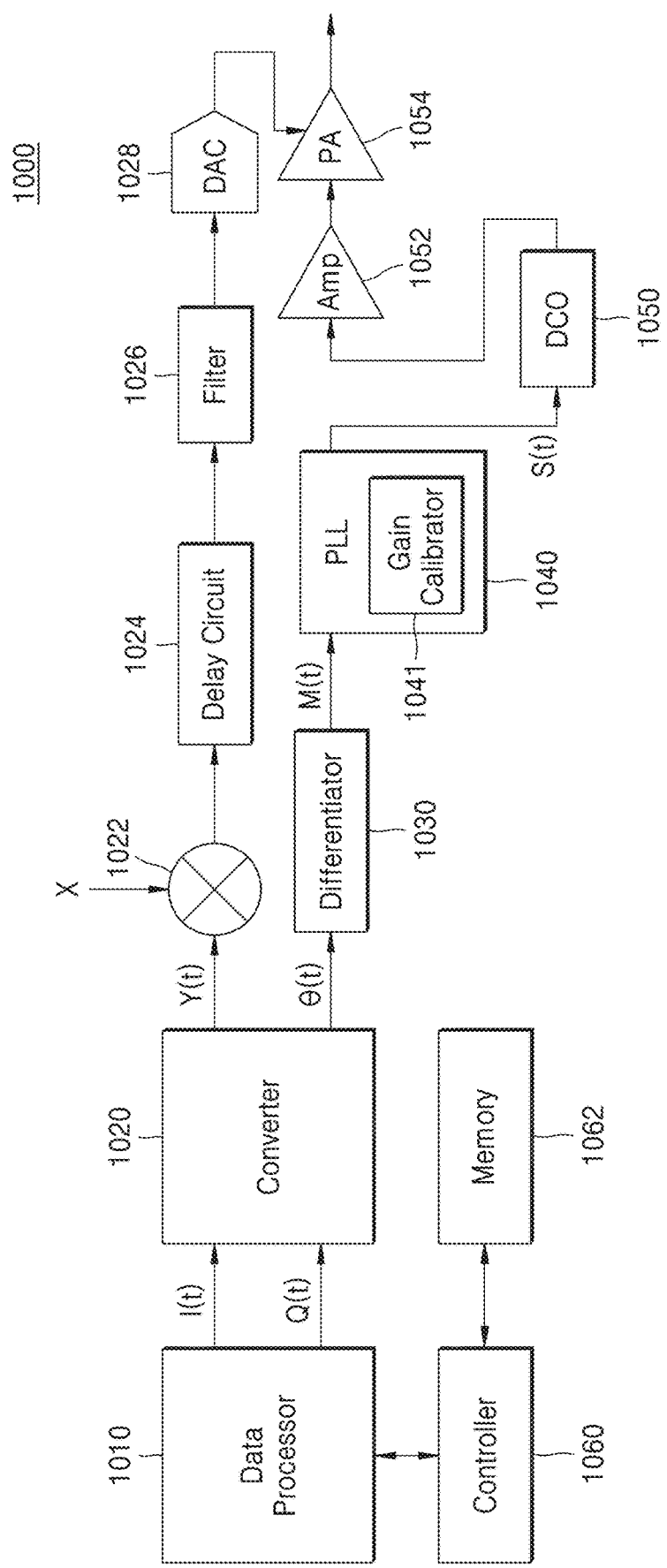
FIG. 10 is a block diagram of an electronic device using a phase locked loop, according to an example embodiment.

FIG. 10 is a block diagram illustrating a design of an electronic device 1000 using a phase locked loop 1040, according to an example embodiment. For example, the electronic device 1000 may be a communication device and may be realized to perform communication with other devices. For example, the electronic device 1000 may be used for a wireless communication device, a cellular phone, a personal digital assistant (PDA), a handheld device, a wireless modem, a wireless telephone, a radio station, a Bluetooth device, a health care device, a wearable device, or the like.

The electronic device may also be used in various wireless communication systems such as a code division multiple access (CDMA) system, a time division multiple access (TDMA) system, a frequency division multiple access (FDMA) system, an orthogonal frequency division multiple access (OFDMA) system, a wireless local area network (WLAN), Wi-Fi, and Bluetooth. The electronic device 1000 may support CDMA wireless technology such as CDMA2000 or a wideband-CDMA (W-CDMA). Also, the electronic device 1000 may support TDMA wireless technology such as a global system for mobile communications (GSM).

In the electronic device 1000, a data processor 1010 may obtain a symbol by processing (e.g., encoding and modulating) data. The data processor 1010 may also obtain a complex-valued sample by performing other processes (e.g., spreading, scrambling, etc.) on the symbol, according to wireless technology used in communications. The data processor 1010 may provide an in-phase data signal I(t) including a real number part of each complex-valued sample and a quadrature data signal Q(t) including an imaginary number part of each complex-valued sample. A converter 1020 may receive the in-phase data signal I(t) and the quadrature data signal Q(t), convert each complex-valued sample from Cartesian coordinates to polar coordinates, and provide an envelope signal Y(t) and a phase signal θ(t).

In an envelope path, a multiplier 1022 may obtain a desired output power level by multiplying a gain X and the envelope signal Y(t). A delay circuit 1024 may provide a programmable amount of delays and temporally align the envelope signal Y(t) and a phase signal. The filter 1026 may filter a delayed envelope signal with an appropriate filter response. A digital-analog converter (DAC) 1028 may convert the filtered envelope signal into an analog signal and may provide an output envelope signal. A gain of a power amplifier (PA) 1054 may be changed because of an output envelope to achieve amplitude modulation.

In a phase path, a differentiator 1030 may differentiate a phase signal θ(t) and provide a modulation signal M(t) including frequency components of the in-phase data signals I(t) and the quadrature data signals Q(t).

A phase locked loop 1040 according to an example embodiment may include a gain calibrator 1041. The phase locked loop 1040 may receive the modulation signal M(t), and according to the example embodiments of FIGS. 1 to 9, a control signal S(t) for a digital control oscillator 1050 may be generated. The digital control oscillator 1050 may generate a phase-modulated signal based on the modulation signal M(t). An amplifier 1052 may amplify the phase-modulated signal. The PA 1054 may also amplify an output from the amplifier 1052 in response to the output envelope signal and may output an RF output signal including a modulated phase and an amplitude quantum.

A controller 1060 may control operations of the data processor 1010 and other blocks in the electronic device 100. A memory 1062 may store data and command codes regarding the controller 1060 and/or other blocks.

In some example embodiments, the phase locked loop 1040 may be realized by processing circuitry executing software logic, and the memory 1062 may store command codes regarding a modulation operation of the phase locked loop 1040. The controller 1060 and the data processor 1010 may perform the modulation operation of the phase locked loop 1040 by executing the command codes stored in the memory 1062.

Also, various blocks in the electronic device 100 may be digitally realized. For example, in the data processor 1010, the filter 1026, the differentiator 1030, and the controller 1060 may be realized as at least one digital processor (DSP), a reduced instruction set computer (RISC), a central processing unit, and the like. A digital block may be embodied on at least one application specific integrated circuit (ASIC) and/or other integrated circuits (ICs). Other blocks in the electronic device 1000 may be realized as analog circuits.

Figure 11:
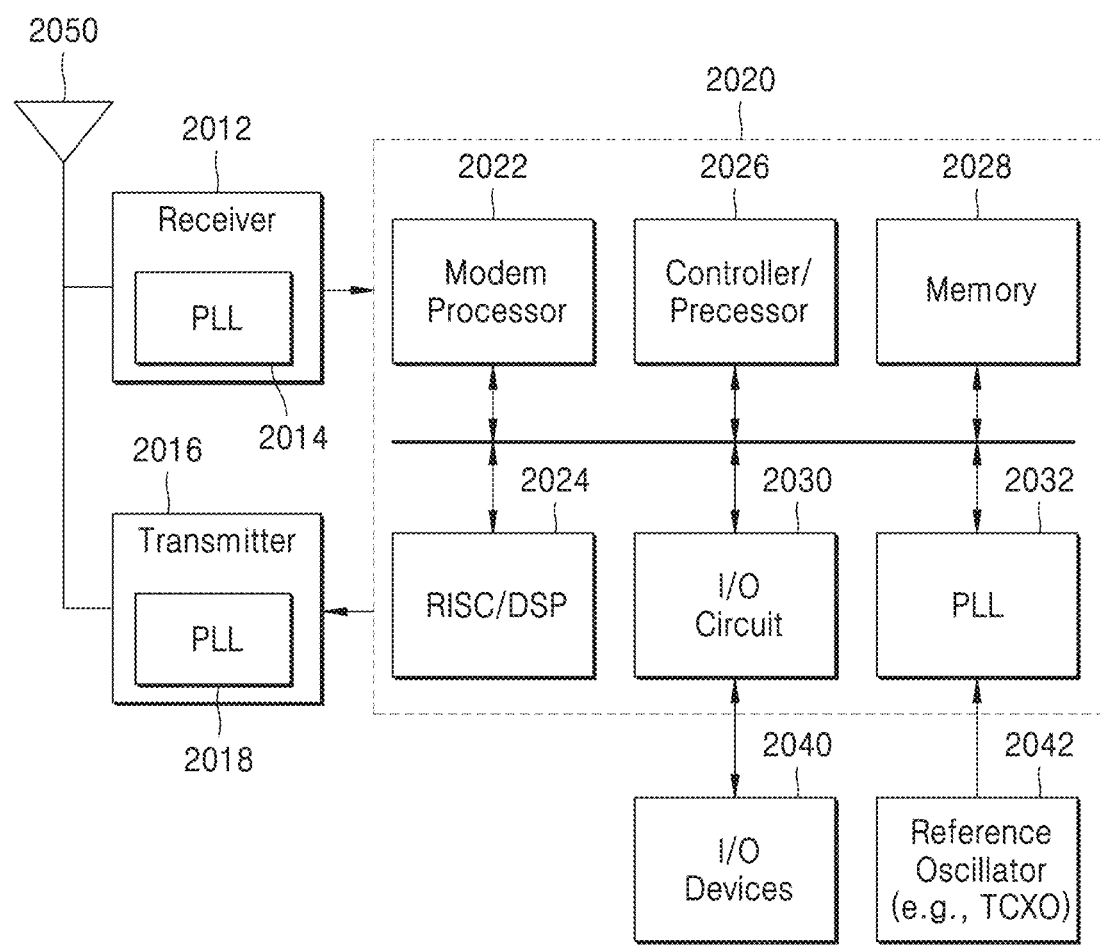
FIG. 11 is a block diagram of a communication device according to an example embodiment.

FIG. 11 is a block diagram of a communication device according to an example embodiment.

Referring to FIG. 11, the communication device may include a receiver 2012, a transmitter 2016, a communication module 2020, an antenna 2050, input/output devices 2040, and a reference oscillator 2042. The receiver 2012 may include a phase locked loop 2014 that generates an output signal according to the embodiments of FIGS. 1 to 9. The transmitter 2016 may include a phase locked loop 2018 that generates the output signal according to the embodiments of FIGS. 1 to 9. The receiver 2012 may convert an analog signal, which is received from the outside through the antenna 2050, into a digital signal by using the output signal of the phase locked loop 2018 and then may provide the digital signal to the communication module 2020. The transmitter 2016 may convert the digital signal, which is received from the communication module 2020, into the analog signal by using the output signal of the phase locked loop 2018 and then may output the analog signal to the outside through the antenna 2050.

The communication module 2020 may include a modem processor 2022, an RISC/DSP 2024, a controller/processor 2026, the memory 2028, the I/O circuit 2030, and a phase locked loop 2032.

The modem processor 2022 may perform processing operations such as encoding, modulation, demodulation, decoding, and the like for data transmission and reception. The RISC/DSP 2024 may perform a processing operation that is general or specialized for the communication device 2000. The controller/processor 2026 may control blocks in the communication module 2020. The memory 2028 may store data and various command codes. The I/O circuit 2030 may communicate with external I/O devices 2040. The phase locked loop 2032 may use a frequency signal received from the reference oscillator 2042 and perform the modulation operation based on the example embodiments of FIGS. 1 to 9. The reference oscillator 2042 may be realized as a crystal oscillator (XO), a voltage controlled crystal oscillator (VCXO), a temperature compensated crystal oscillator (TCXO), or the like. The communication module 2020 may use the output signal generated from the phase locked loop 2032 and may perform a processing operation necessary for communications.

Figure 12:
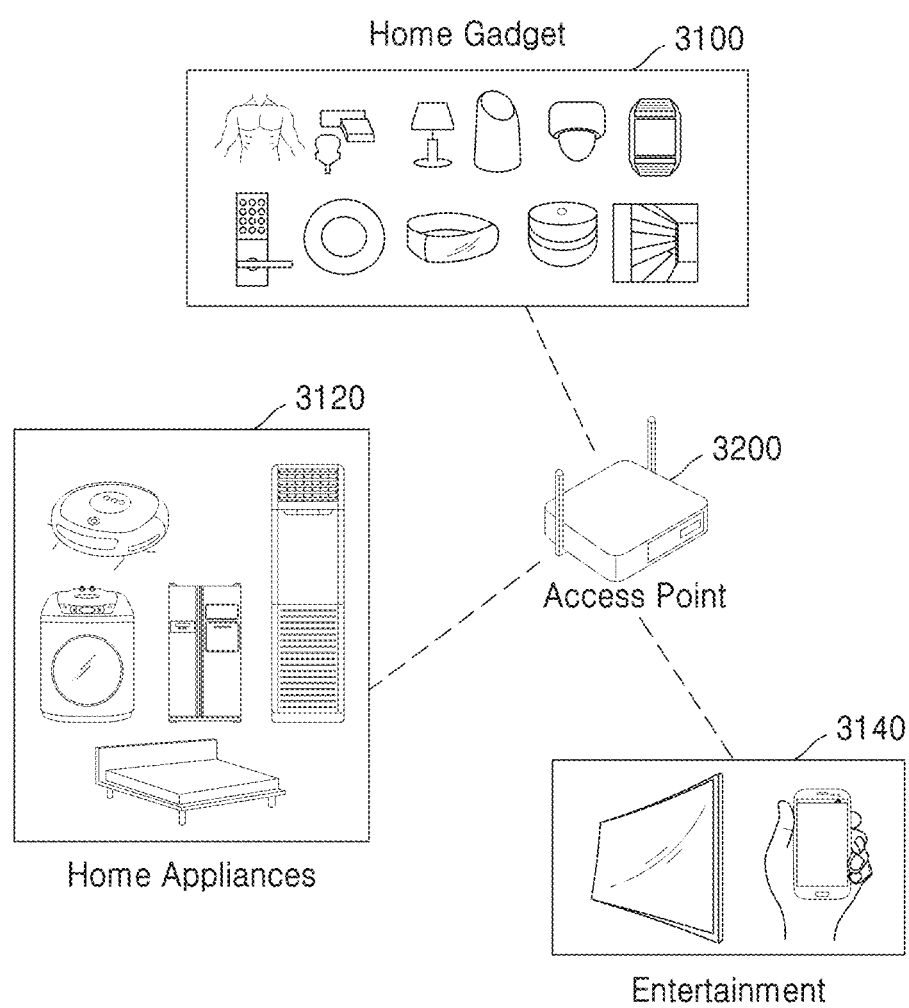
FIG. 12 is a diagram illustrating communication devices including a phase locked loop, according to an example embodiment.

FIG. 12 is a diagram illustrating communication devices included in a phase locked loop, according to an example embodiment.

Referring to FIG. 12, home gadgets 3100, home appliances 3120, entertainment devices 3140, and an access point (AP) 3200 may respectively include phase locked loops according to one or more example embodiments. In some example embodiments, the home gadgets 3100, home appliances 3120, entertainment devices 3140, and the AP 3200 may form an Internet of Things (IoT) network system. The communication devices shown in FIG. 12 are merely examples, and other communication devices that are not shown in FIG. 12 may include a phase locked loop according to one or more example embodiments of the inventive concepts.

While example embodiments of the inventive concepts have been particularly shown and described with reference to some example embodiments thereof, it will be understood that various changes in form and details may be made therein without departing from the spirit and scope of the following claims.

What is claimed is:

1. An electronic device comprising:
a phase locked loop configured to perform a two-point modulation operation on a data signal using first and second modulation paths by,
calibrating a gain by accumulating a delta gain based on a differential value of a first phase error signal generated in the first modulation path, and
adjusting a frequency variation of the data signal through the second modulation path to match the frequency variation of the data signal through the first modulation path based on the calibrated gain.

2. The electronic device of claim 1, wherein the phase locked loop comprises processing circuitry configured to function as a gain calibrator to,
generate the differential value of the first phase error signal from the first phase error signal received through the first modulation path,
generate the delta gain based on the differential value, and
generate the calibrated gain by accumulating the delta gain.

3. The electronic device of claim 2, wherein the gain calibrator is configured to generate the delta gain having a magnitude proportional to a magnitude of the differential value.

4. The electronic device of claim 2, wherein the gain calibrator is further configured to generate the differential value according to timing of a transition of a level of the data signal.

5. The electronic device of claim 2, wherein the gain calibrator is further configured to identify whether the differential value is in a reference range and scale the delta gain based on an identification result.

6. The electronic device of claim 5, wherein the gain calibrator is further configured to scale the delta gain at a set ratio in response to the differential value being within the reference range.

7. The electronic device of claim 5, wherein the gain calibrator is further configured to,
generate a second phase error signal from a test data signal for a set period of time, and
set the reference range based on a maximum value and a minimum value of the second phase error signal.

8. The electronic device of claim 2, wherein the gain calibrator is further configured to filter a high-frequency component of the first phase error signal before generating the differential value.

9. The electronic device of claim 1, wherein
the first modulation path is a lowpass modulation path,
the second modulation path is a highpass modulation path, and
the phase locked loop is further configured to adaptively adjust the gain of the highpass modulation path.

10. The electronic device of claim 1, wherein the phase looked loop comprises processing circuitry,
wherein the processing circuitry is configured, within the first modulation path, to function as,
a divider configured to divide an output signal of the phase locked loop to generate a divided output signal;
a time-to-digital converter configured to compare the divided output signal with a reference frequency signal, and generate a comparison signal based thereon; and a loop filter configured to generate a first control signal based on the comparison signal such that the first control signal includes the first phase error signal,
wherein the processing circuitry is configured, within the second modulation path, to function as a multiplier to generate a second control signal by multiplying the data signal and the gain.

11. The electronic device of claim 10, wherein the processing circuitry is further configured to function as,
a summer configured to generate a third control signal by aggregating the first control signal and the second control signal; and
an oscillator configured to output the output signal based on the third control signal.

12. The electronic device of claim 1, wherein the phase locked loop is further configured to lock the gain by performing a background operation.

13. An electronic device comprising:
a processor configured to perform a two-point modulation operation on a data signal through first and second modulation paths of a digital phase locked loop, by
calibrating a gain by accumulating a delta gain based on a differential value of a phase error signal generated in the first modulation path, and
adjusting a frequency variation of the data signal through the second modulation path to match the frequency variation of the data signal through the first modulation path based on the calibrated gain.

14. The electronic device of claim 13, wherein the processor is configured to,
generate the differential value of the phase error signal from the phase error signal generated in the first modulation path,
generate the delta gain based on the differential value, and
generate the calibrated gain by accumulating the delta gain.

15. A method of operating an electronic device, the method comprising:
applying a data signal to a lowpass modulation path and a highpass modulation path of a phase locked loop;
generating a differential value from a phase error signal generated in the lowpass modulation path;
calibrating a gain for adjusting a frequency variation of the data signal through the highpass modulation path, by accumulating a delta gain based on the differential value; and
performing a two-point modulation operation on the data signal through the lowpass modulation path and the highpass modulation path, based on the gain.

16. The method of claim 15, wherein the generating of the gain comprises:
generating the delta gain based on the differential value; and
accumulating the delta gain to generate the gain.

17. The method of claim 16, wherein a magnitude of the delta gain is proportional to a magnitude of the differential value.

18. The method of claim 16, wherein the generating of the delta gain comprises:
identifying whether the differential value is in a reference range; and
scaling the delta gain based on a result of the identifying.

19. The method of claim 16, wherein the generating of the delta gain is performed during a set time corresponding to a timing of a transition of a level of the data signal.

20. The method of claim 15, wherein the generating of the differential value comprises:
filtering a high-frequency component of the phase error signal to generate a filtered phase error signal; and
generating the differential value from the filtered phase error signal.

* * * * *